US011811180B2

(12) United States Patent
Ai-Ong et al.

(10) Patent No.: US 11,811,180 B2
(45) Date of Patent: Nov. 7, 2023

(54) ELECTRICAL CONTACT FOR SEMICONDUCTOR PACKAGE

(71) Applicant: IXYS Semiconductor GmbH, Lampertheim (DE)

(72) Inventors: Yong Ai-Ong, Singapore (SG); Thomas Spann, Furth (DE)

(73) Assignee: IXYS Semiconductor GmbH, Lampertheim (DE)

( * ) Notice: Subject to any disclaimer, the term of this patent is extended or adjusted under 35 U.S.C. 154(b) by 52 days.

(21) Appl. No.: 17/462,825

(22) Filed: Aug. 31, 2021

(65) Prior Publication Data

US 2022/0085525 A1    Mar. 17, 2022

(30) Foreign Application Priority Data

Sep. 14, 2020  (EP) ..................... 20195996

(51) Int. Cl.
*H01R 4/18*     (2006.01)
*H01L 23/498*   (2006.01)
*H01R 12/58*    (2011.01)

(52) U.S. Cl.
CPC ........ *H01R 4/187* (2013.01); *H01L 23/49811* (2013.01); *H01R 12/58* (2013.01)

(58) Field of Classification Search
CPC ... H01L 23/49811; H01R 4/187; H01R 12/58; H01R 4/02; H01R 13/04; H01R 12/57
See application file for complete search history.

(56) References Cited

U.S. PATENT DOCUMENTS

| | | | | | |
|---|---|---|---|---|---|
| 3,115,379 | A | * | 12/1963 | McKee | H01R 13/28 439/290 |
| 3,599,234 | A | * | 8/1971 | Andreini | H01R 13/518 361/756 |
| 3,780,433 | A | * | 12/1973 | Lynch | H01R 12/58 439/83 |
| 3,864,014 | A | * | 2/1975 | Lynch | H01R 12/58 439/876 |
| 4,436,358 | A | * | 3/1984 | Coldren | H01R 12/58 439/83 |
| 4,697,864 | A | * | 10/1987 | Hayes | H01R 12/724 439/444 |
| 4,720,770 | A | * | 1/1988 | Jameson | H01L 23/49811 361/705 |
| 4,767,350 | A | * | 8/1988 | Cooper | H01R 12/716 439/748 |

(Continued)

FOREIGN PATENT DOCUMENTS

JP         S4410995 Y1    5/1969

*Primary Examiner* — William H. Mayo, III
*Assistant Examiner* — Rhadames Alonzo Miller
(74) *Attorney, Agent, or Firm* — KDW Firm PLLC

(57) ABSTRACT

Provided herein are semiconductor packages with improved electrical contacts (e.g. pins). In some embodiments, an assembly may include a substrate and an electrical contact coupled to the substrate, the electrical contact consisting of a first component defined by a complex 3D designed receiving pin. The electrical contact may further include a second component defined by another complex 3D designed penetrating pin, wherein the first component engages the second component to deform mechanically and to weld when the first component and the second component are coupled together.

18 Claims, 11 Drawing Sheets

(56) References Cited

U.S. PATENT DOCUMENTS

| Patent/Publication | Date | Inventor | Classification |
|---|---|---|---|
| 4,872,846 A * | 10/1989 | Clark | H01R 4/02 439/83 |
| 5,302,778 A * | 4/1994 | Maurinus | H01L 33/58 257/E31.127 |
| 5,446,624 A * | 8/1995 | Saito | G01R 1/07307 361/772 |
| 5,463,532 A * | 10/1995 | Petitpierre | H05K 9/0016 174/355 |
| 5,491,613 A * | 2/1996 | Petitpierre | H05K 7/1409 174/355 |
| 5,554,037 A * | 9/1996 | Uleski | H01H 19/585 439/741 |
| 6,166,464 A * | 12/2000 | Grant | H05K 7/20854 310/68 R |
| 6,271,480 B1 * | 8/2001 | Yamaguti | H05K 3/303 174/267 |
| 6,447,305 B1 * | 9/2002 | Roberts | H01R 12/774 439/495 |
| 6,545,890 B2 * | 4/2003 | Pitzele | H01R 12/58 29/852 |
| 6,628,860 B1 * | 9/2003 | Van Doorn | G02B 6/4249 385/88 |
| 6,773,269 B1 * | 8/2004 | Downes | H05K 3/368 439/55 |
| 9,585,263 B2 * | 2/2017 | Matoy | H01R 12/55 |
| 2002/0155692 A1 * | 10/2002 | Kong | H01L 25/0657 257/E25.013 |
| 2003/0042595 A1 * | 3/2003 | Canella | H01L 23/49811 257/737 |
| 2005/0070133 A1 * | 3/2005 | Canella | H05K 3/325 439/70 |
| 2005/0079766 A1 * | 4/2005 | Ho | H01R 12/721 439/630 |
| 2006/0189199 A1 * | 8/2006 | Lang | H01R 12/7005 439/374 |
| 2009/0197439 A1 * | 8/2009 | Nabilek | H01R 12/585 439/825 |
| 2014/0179173 A1 * | 6/2014 | Suzuki | H01R 12/585 439/751 |
| 2014/0301042 A1 * | 10/2014 | Stella | H05K 13/0465 228/180.1 |
| 2015/0364847 A1 * | 12/2015 | Yao | H01R 12/585 439/869 |
| 2017/0176508 A1 * | 6/2017 | Song | G01R 31/002 |
| 2018/0109026 A1 * | 4/2018 | Kurumaddali | H01R 12/7005 |

\* cited by examiner

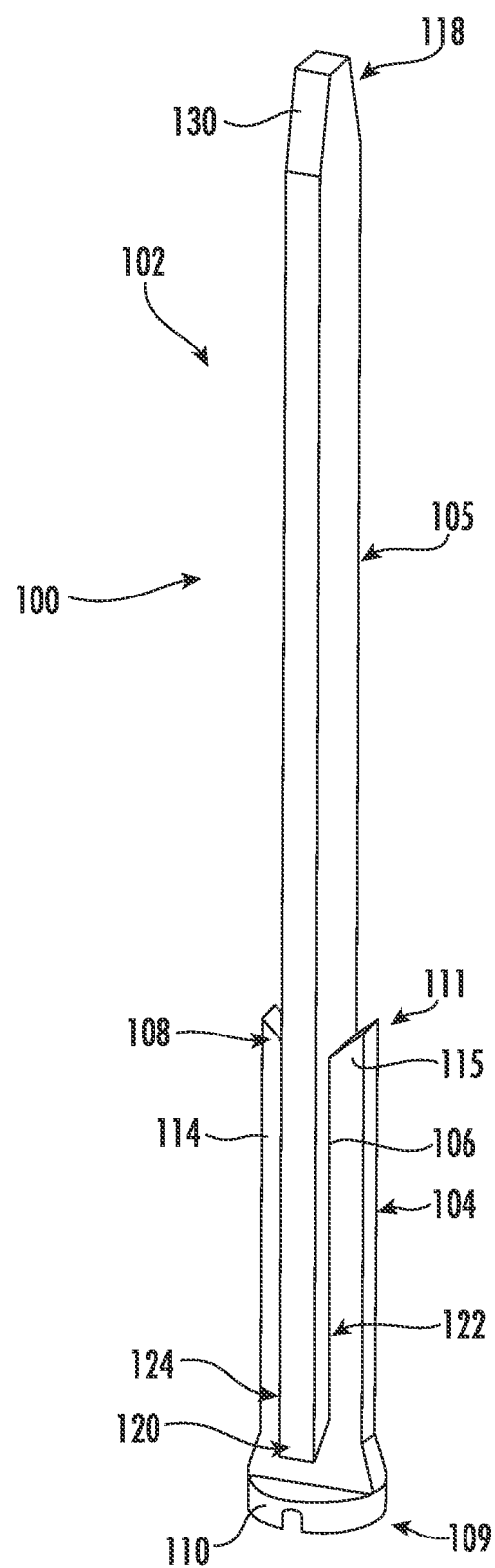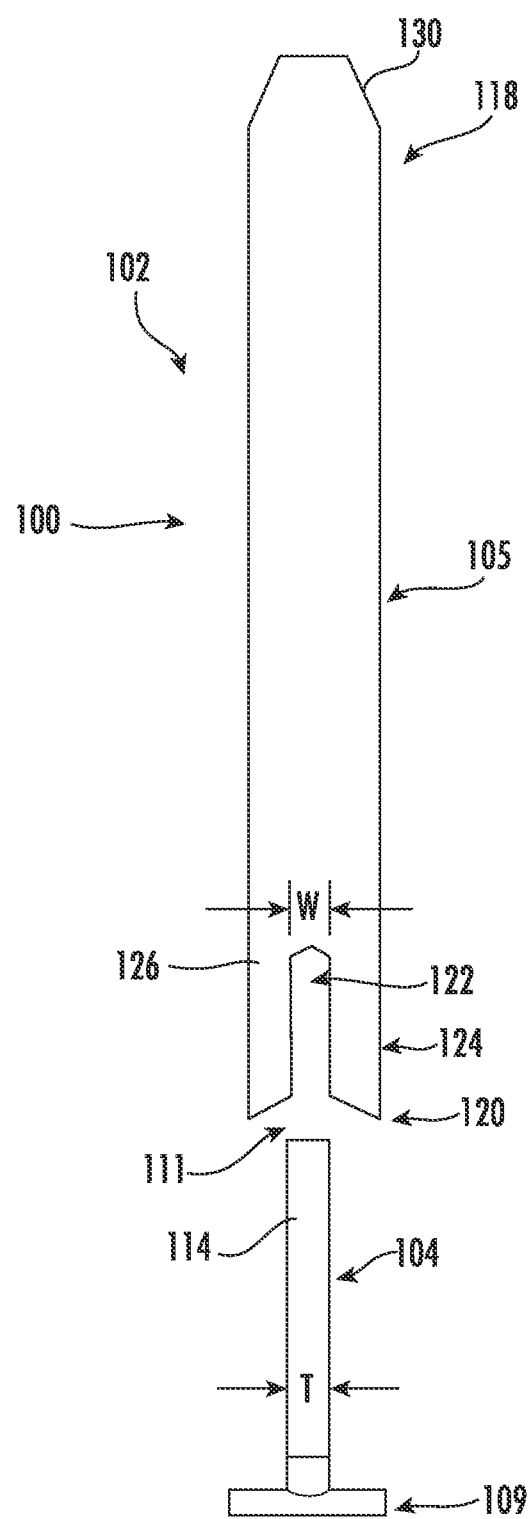
FIG. 1A
FIG. 1B

700

```
┌─────────────────────────────────────────────────────────┐
│ COUPLING A FIRST COMPONENT OF AN ELECTRICAL CONTACT TO A │
│ SUPPORTING STRUCTURE, THE FIRST COMPONENT INCLUDING A    │──701
│         PIN DEFINED BY A SLOPED TIP                      │
└─────────────────────────────────────────────────────────┘
                             │
                             ▼
┌─────────────────────────────────────────────────────────┐
│   COUPLING A SECOND COMPONENT TO THE FIRST COMPONENT,    │
│   WHEREIN THE SECOND COMPONENT INCLUDES A HOLLOW         │──702
│                     CYLINDER                             │
└─────────────────────────────────────────────────────────┘
```

FIG. 12

ELECTRICAL CONTACT FOR SEMICONDUCTOR PACKAGE

FIELD OF THE DISCLOSURE

The disclosure relates generally to semiconductor device packaging and, more particularly, to electrical contacts for semiconductor packages.

BACKGROUND OF THE DISCLOSURE

Semiconductor device packages, or modules, often include elements to mount or otherwise couple the package to a printed circuit board (PCB) or to other elements. Such mounting elements often include electrical contacts, or pins, that are configured to be press-fit into receivers of a PCB/motherboard or other element. Press-fit pins serve to establish solderless electrical connections by introducing the pins into corresponding bores of a carrier, the bore having a smaller diameter than the pin. In some approaches, the bore may be lined with a conductive material.

SUMMARY

In view of the foregoing, in one approach, an assembly may include a substrate, and an electrical contact coupled to the substrate. The electrical contact may include a first component including a base slot defined by a first set of prongs, and a second component including an upper slot defined by a second set of prongs, wherein the first set of prongs engage the second set of prongs when the first component and the second component are coupled together.

In another approach, an electrical contact may include a first component including a base slot defined by a first set of prongs, the first component coupleable with a substrate. The electrical contact may further include a second component including an upper slot defined by a second set of prongs, wherein the first set of prongs engage the second set of prongs when the first component and the second component are coupled together.

In another approach, a method may include coupling a first component of an electrical contact to a substrate, the first component including a base slot defined by a first set of prongs and coupling a second component to the first component. The second component may include an upper slot defined by a second set of prongs, wherein the first set of prongs engage the second set of prongs.

In yet another approach, an assembly may include a substrate and an electrical contact coupled to the substrate. The electrical contact may include a first component extending perpendicular from the substrate, and a second component surrounding the first component, wherein the first component extends within a hollowed interior of the second component.

BRIEF DESCRIPTION OF THE DRAWINGS

FIG. 1A is a perspective view of an electrical contact for a semiconductor package according to exemplary embodiments of the present disclosure.

FIG. 1B is an exploded view of the electrical contact of FIG. 1A according to exemplary embodiments of the present disclosure.

FIG. 12 is a flowchart illustrating a method according to exemplary embodiments of the present disclosure.

Figure 1C:
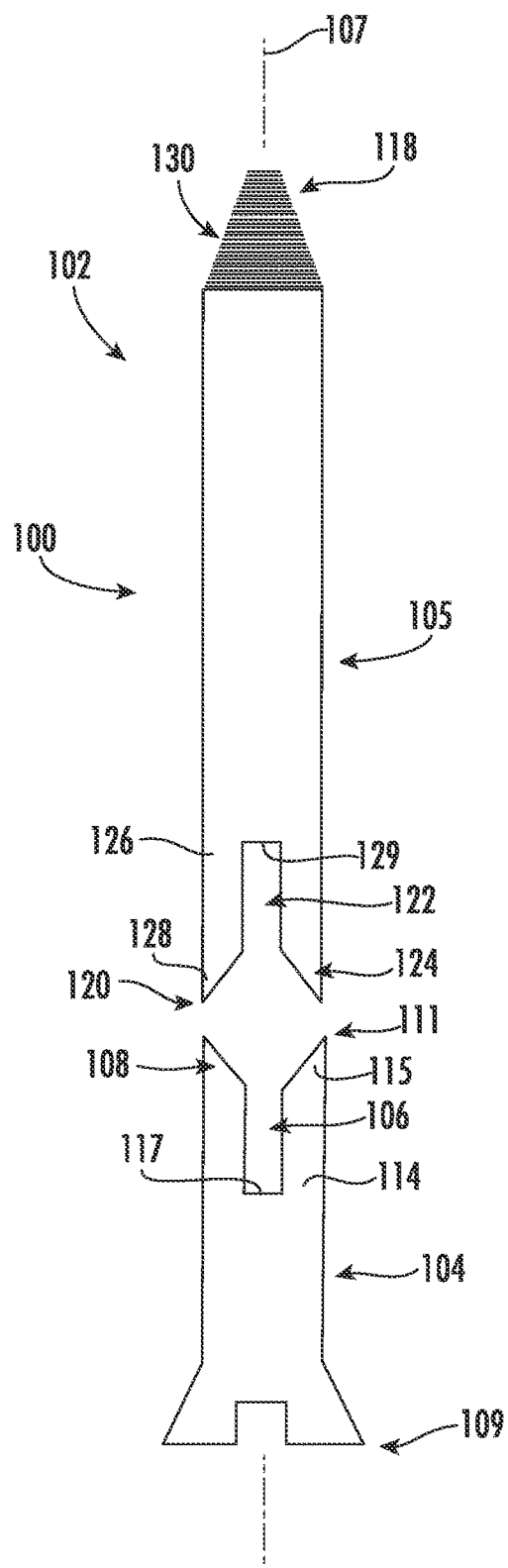
FIG. 1C is another exploded view of the electrical contact of FIG. 1A according to exemplary embodiments of the present disclosure.

The drawings are not necessarily to scale. The drawings are merely representations, not intended to portray specific parameters of the disclosure. The drawings are intended to depict typical embodiments of the disclosure, and therefore should not be considered as limiting in scope. In the drawings, like numbering represents like elements.

Furthermore, certain elements in some of the figures may be omitted, or illustrated not-to-scale, for illustrative clarity. Furthermore, for clarity, some reference numbers may be omitted in certain drawings.

DETAILED DESCRIPTION

Embodiments in accordance with the present disclosure will now be described more fully hereinafter with reference to the accompanying drawings. The systems, assemblies, and methods may be embodied in many different forms and should not be construed as being limited to the embodiments set forth herein. Rather, these embodiments are provided so that this disclosure will be thorough and complete, and will fully convey the scope of the systems, assemblies, and methods to those skilled in the art.

Embodiments herein advantageously provide a semiconductor device package including improved electrical contacts. As will be described further herein, electrical contacts of the present disclosure may include two or more components coupled together to form a one-body pin. A first, base portion of the pin may be first attached to a substrate, and a second, upper portion of the pin may then be coupled to the first component, e.g., after wire bonding. Each of the components may include a set of prongs, which compliment when the components are coupled together. A gap or slot between the prongs may provide stress relief during the mating process of the first and second components.

Referring now to FIGS. 1A-1C, an electrical contact 100 of an assembly 102 according to embodiments of the present disclosure will be described. As shown, the electrical contact 100, sometimes referred to as a pin, may include a first component 104 and a second component 105 generally aligned end-to-end along a lengthwise axis 107. The electrical contact 100 is shown in a connected configuration in FIG. 1A, and in a separated or disconnected configuration in FIGS. 1B-1C. As will be described in greater detail herein, the first and second components 104, 105 may be coupled together after the first component 104 has been secured to a substrate (not shown).

The first component 104 may include a first end 109 opposite a second end 111. The first end 109 may include a flared base 110 to provide support to the first component 104, and to increase adhesion of the electrical contact 100 to a substrate. The second end 111 may include a base slot 106 formed therein, wherein the base slot 106 is defined in part by a first set of members or prongs 108. In some embodiments, the prongs 108 may include a base 114 and a free end 115. The free end 115 of the prongs 108 may be configured to flex, e.g., radially away and/or towards the lengthwise axis 107 to change the width of the base slot 106. The prongs 108 may exhibit good spring characteristics. Each of the prongs 108 may be connected by a first base wall 117. As shown, the first base wall 117 may be a planar surface extending generally perpendicular to the lengthwise axis 107.

The second component 105 may include a first end 118 opposite a second end 120. The second end 120 may include an upper slot 122 formed therein, wherein the upper slot 122 is defined in part by a second set of members or prongs 124. In some embodiments, the prongs 124 may include a base 126 and a free end 128. The free end 128 of the prongs 124 may be configured to flex, e.g., radially away and/or towards the lengthwise axis 107 to change the width of the upper slot 122. The prongs 124 may exhibit good spring characteristics. Each of the prongs 124 may be connected by a second base wall 129. As best shown in FIG. 1B, a thickness 'T' of the first component 104 may be substantially the same as a width 'W' of the upper slot 122 to ensure proper assembly and support for the first and second components 104, 105.

Figure 2:
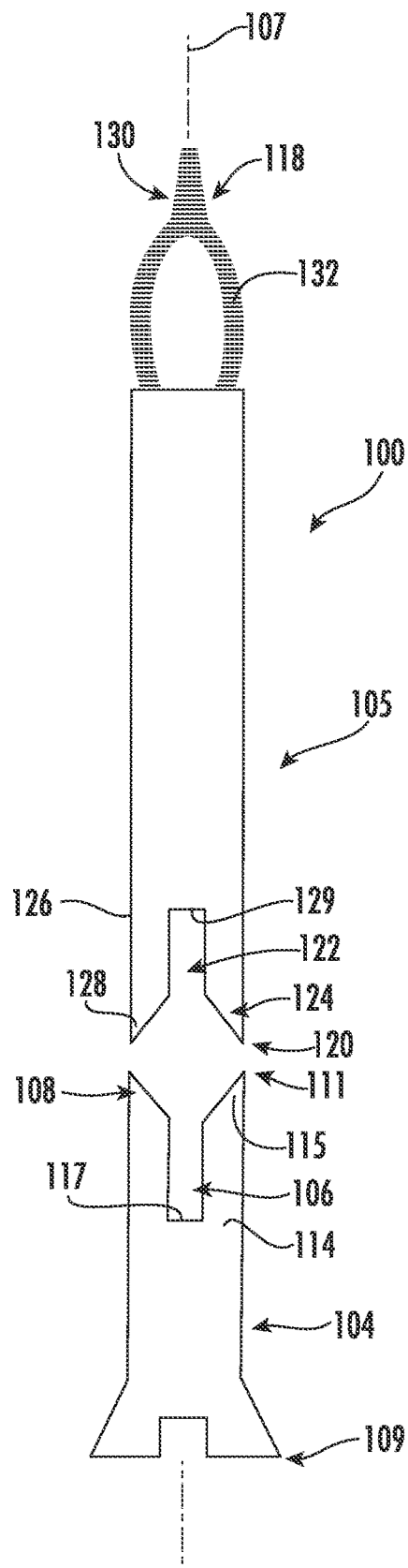
FIG. 2 is an exploded view of an electrical contact for the semiconductor package according to exemplary embodiments of the present disclosure.

At the first end 118 of the second component 105 may be an angled tip 130. In the embodiment shown in FIG. 2, the angled tip 130 may include a loop 132. Although non-limiting, the first and second components 104, 105 may be same material (e.g., copper or a copper alloy with a Sn surface, galvanically formed, and with an appropriate μm thickness) with a same hardness, thus allowing optimal cold welding and preventing coefficient of thermal expansion (CTE) mismatch during extreme temperatures.

Figure 3A:
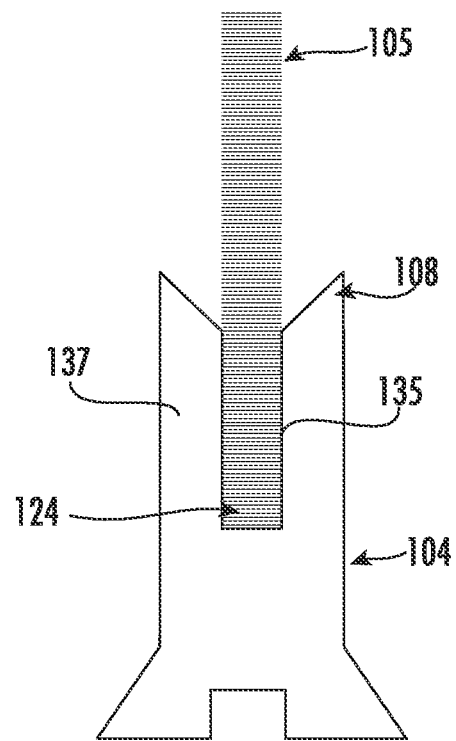
FIGS. 3A-3B are side views of the electrical contact for the semiconductor package according to exemplary embodiments of the present disclosure.
Figure 3B:
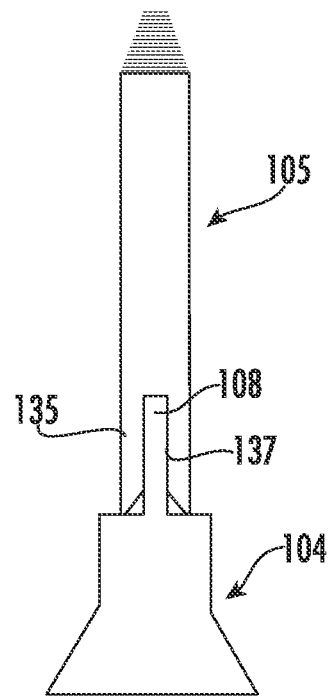
Figure 3C:
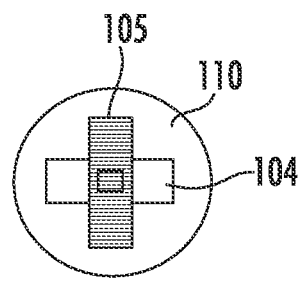
FIG. 3C is a top view of the electrical contact of FIGS. 3A-3B according to exemplary embodiments of the present disclosure.

As shown in FIGS. 3A-3C, the first prongs 108 and the second prongs 124 may engage one another to couple the first and second components 104, 105 together. In some embodiments, the first component 105 demonstrated in FIGS. 1-2 may be rotated by approximately 90 degrees and then lowered onto the second component 105 until the first component 104 is inserted into the upper slot 122 and the second component 105 is inserted into the base slot 106. Once engaged, the first base wall 117 and the second base wall 129 may abut or engage one another to prevent further axial movement of the first component 104. It will be appreciated that the base slot 106 and the upper slot 122 provide stress relief during the mating process of the first and second components 104, 105.

As shown, the first prongs 108 and the second prongs 124 extend adjacent one another such that the first prongs 108 extend along an exterior surface 135 of the second component 105, and the second set of prongs 124 extends along an exterior surface 137 of the first component 104. The first prongs 108 and the second prongs 124 may generally be oriented parallel to one another and to the lengthwise axis 107.

Figure 4A:
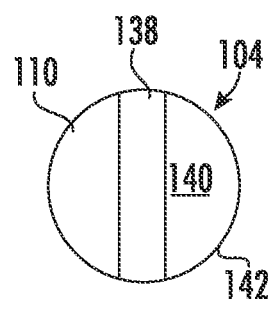
FIGS. 4A-4C are bottom views of various electrical contacts according to exemplary embodiments of the present disclosure.
Figure 4B:
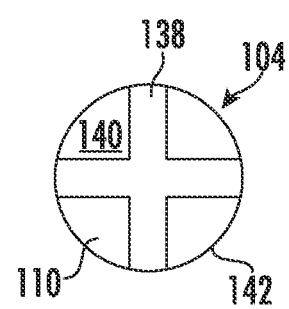
Figure 4C:
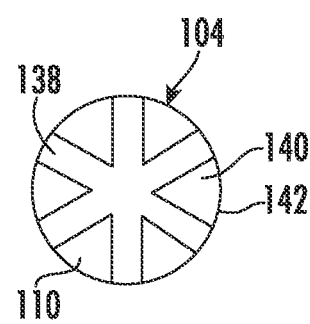

As shown in the various embodiments of FIGS. 4A-4C, the first component 104 may include one or more stress relief trenches 138 formed along a bottom surface 140 of the flared base 110 at the first end 109 of the device 100. As shown, the stress relief trenches 138 may be formed across a perimeter 142 of the bottom surface 140. It will be appreciated that virtually any number or configuration of the stress relief trenches 138 may be possible. Advantageously, a footprint (e.g., defined by the area of the bottom surface 140 of the flared base 110) may be smaller than prior designs, thus providing additional valuable direct copper bonding (DCB) landing for die and wire bonding. However, specific dimensions of the electrical contact 100 may vary according to the application.

Figure 5:
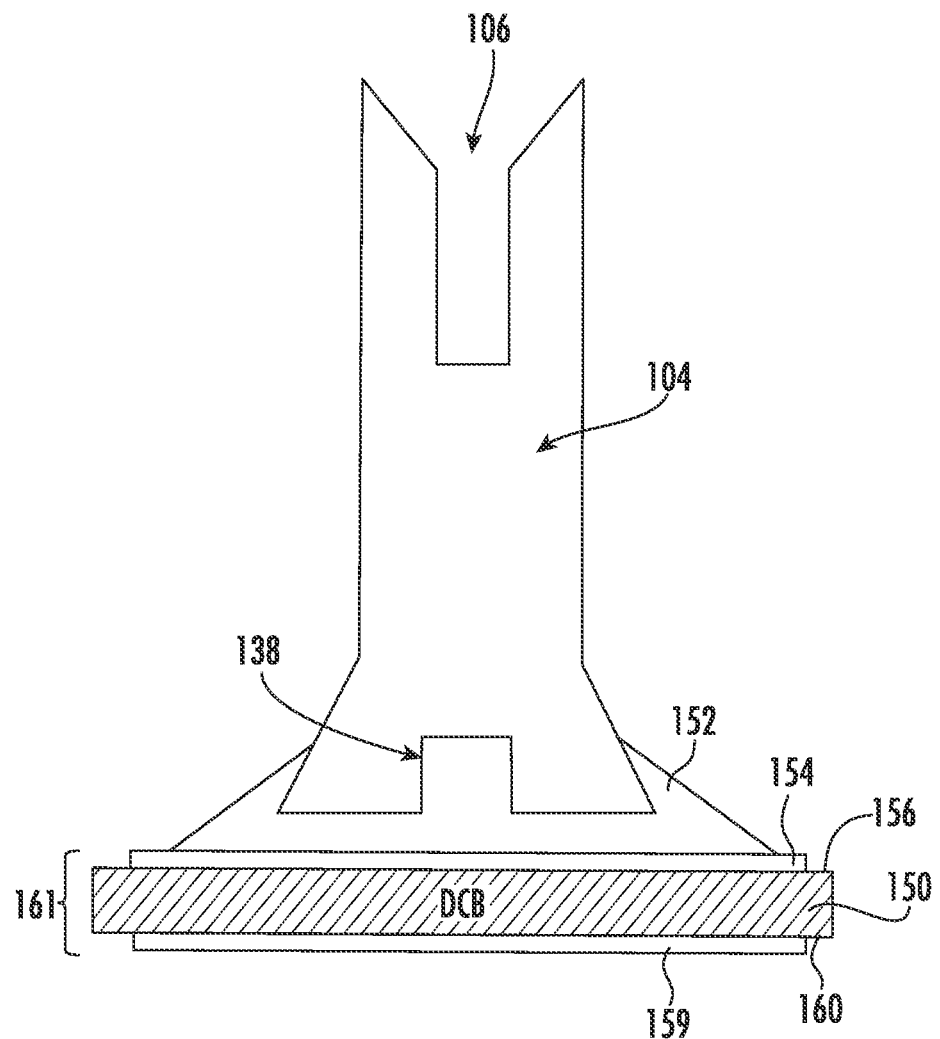
FIG. 5 is a side view demonstrating connection of the electrical contact with a substrate according to exemplary embodiments of the present disclosure.

The stress relief trenches 138 may further increase adhesion between the first component 104 and an electrically insulating material 150, as shown in FIG. 5. In this embodiment, the first component 104 is joined to a substrate 161 by a solder 152, deposited to the substrate 161, or otherwise secured (e.g., fused, soldered, bonded, or welded) onto a conductive layer 154 along a top surface 156 of the electrically insulating material (e.g., dielectric material) 150. As shown, the solder 152 may enter the stress relief trench 138. In some embodiments, a second conductive layer 159 is secured (e.g., fused, soldered, bonded, or welded) to the bottom surface 160 of the electrically insulating material 150. In some embodiments, the first conductive layer 154 is secured (e.g., bonded, brazed, sintered) to the top surface 156 of the electrically insulating material 150. The conductive layer 154, the electrically insulating material 150, and the second conductive layer 159 form a complete direct copper bonding (DCB) supporting structure. In some embodiments, the electrically insulating material 150 may be ceramic and the conductive layers 154, 159 may be copper secured (e.g., fused, soldered, bonded, or welded) to opposite sides of the electrically insulating material 150 at a high temperature. In other embodiments the electrically insulating material 150 may be ceramic and the conductive layers 154, 159 may be aluminum secured (e.g., bonded, brazed, sintered) to opposite sides of the electrically insulating material 150 at high temperature. In other non-limiting embodiments, the substrate 161 may be a copper leadframe. After the first component 104 has been secured (e.g., fused, soldered, bonded, or welded) to the electrically insulating material 150, the second component 105 may be coupled to the first component 104, e.g., by inserting the second component 105 into the base slot 106, as described above.

In some embodiments, the substrate 161 may include multiple layers. For example, the substrate 161 may be a power electronic substrate coupled to a baseplate, which in turn may be coupled to a heat sink or the like. In other embodiments, the baseplate may be omitted, and the substrate 161 may be directly coupled to a heat sink or the like. The power electronic substrate may include, by non-limiting example, a direct bonded copper (DBC) substrate, an active metal brazed (AMB) substrate, an insulated metal substrate (IMS), a thick film ceramic substrate, and the like.

Figure 6:
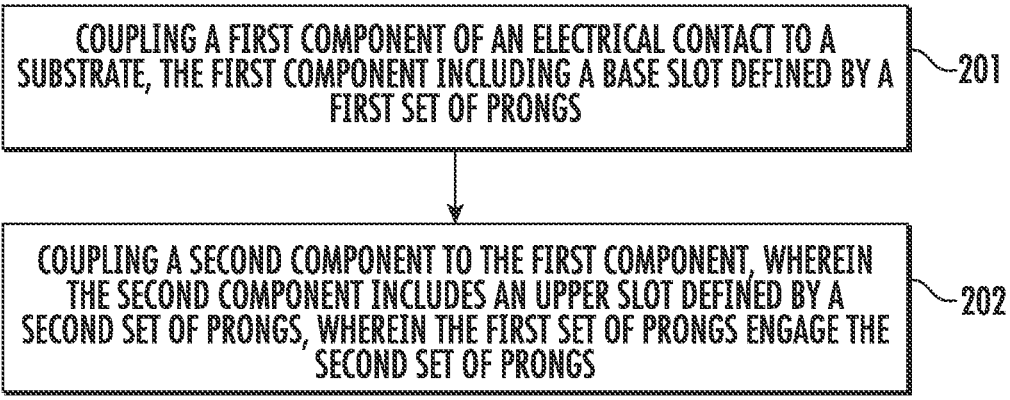
FIG. 6 is a flowchart illustrating a method according to exemplary embodiments of the present disclosure.

Turning now to FIG. 6, a method 200 according to embodiments of the present disclosure will be described in greater detail. At block 201, the method 200 may include coupling a first component of an electrical contact to a substrate, the first component including a base slot defined by a first set of prongs. In some embodiments, the method may include providing a conductive layer over the substrate, and coupling the first component to the conductive layer by a solder.

At block 202, the method 200 may further include coupling a second component to the first component, wherein the second component includes an upper slot defined by a second set of prongs, wherein the first set of prongs engage the second set of prongs. In some embodiments, the method further includes positioning the first set of prongs and the second set of prongs adjacent one another when the first component and the second component are coupled together, wherein the first set of prongs and the second set of prongs are oriented parallel to a lengthwise axis extending through the first component and the second component.

In some embodiments, the method may include inserting the first component within the upper slot, and inserting the second component within the base slot, wherein the first set of prongs extends along an exterior surface of the second component. The second set of prongs may extend along an exterior surface of the first component. In some embodiments, two cooperating stops of the first and second components may block the movement of the first and second components towards each other.

Figure 7:
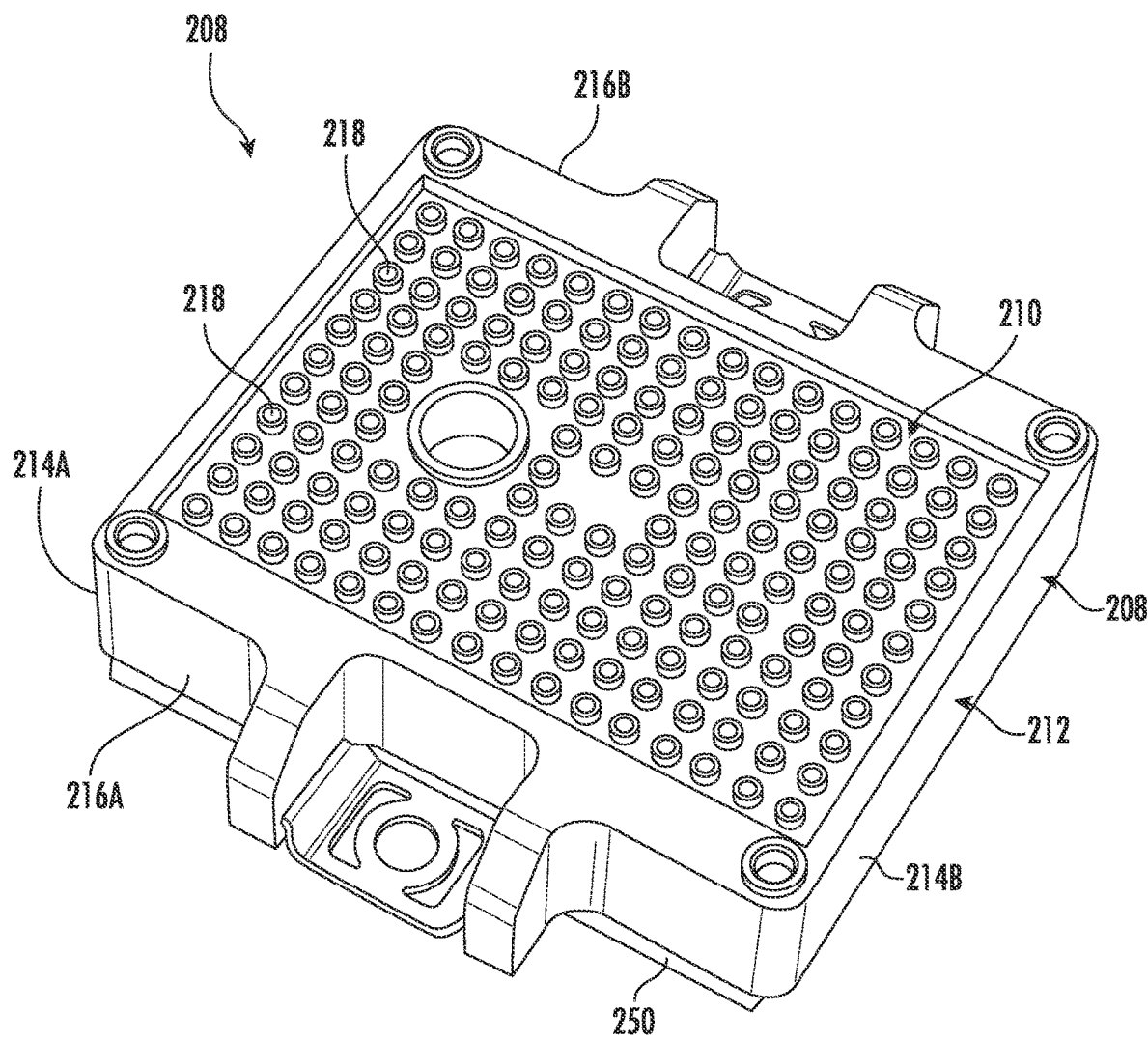
FIG. 7 is a perspective view of a package according to exemplary embodiments of the present disclosure.

Although non-limiting, the electrical contact 100 described herein may be used with the package 205 shown in FIG. 7. In this embodiment, the package 205 may include a housing 208 having a main body 210 and a wall 212 extending around a perimeter of the main body 210. The wall 212 may include a pair of end walls 214A, 214B and a pair of sidewalls 216A, 216B. As shown, the pair of end walls 214A, 214B and the pair of sidewalls 216A, 216B extend perpendicularly from the main body 210. Together, the main body 210 and the wall 212 define an internal cavity (not shown) for housing one or more semiconductor devices.

The main body 210 may further include a plurality of terminal openings 218 configured to receive the electrical contact(s) 100 of the present disclosure. The main body 210 and the wall 212 define an internal cavity housing one or more semiconductor devices coupled to the substrate 250. In some embodiments, the semiconductor devices may include one or more power semiconductor dies, such as one or more power metal-oxide-semiconductor field-effect transistors (power MOSFETs), one or more insulated-gate bipolar transistors (IGBTs), and the like.

The electrical contacts, once coupled to the substrate 250, are configured to extend upwards such as to exit the terminal openings 218 in the main body 210 when the package 205 is lowered towards the substrate 250. The main body 210 may be attached to the substrate 250 and/or baseplate or otherwise coupled thereto, such as using screws, a friction fit, an adhesive, soldering, and the like. The electrical contacts, which extend upwards through the terminal openings 218, are used to couple the one or more die to one or more power sources, one or more electrical grounds, one or more electrical components external to the package 205, and the like by coupling the electrical contacts to a motherboard, printed circuit board (PCB) or the like. As indicated previously, each electrical contact may be coupled the die using a network of connection traces on a surface of the substrate 250.

Figure 8:
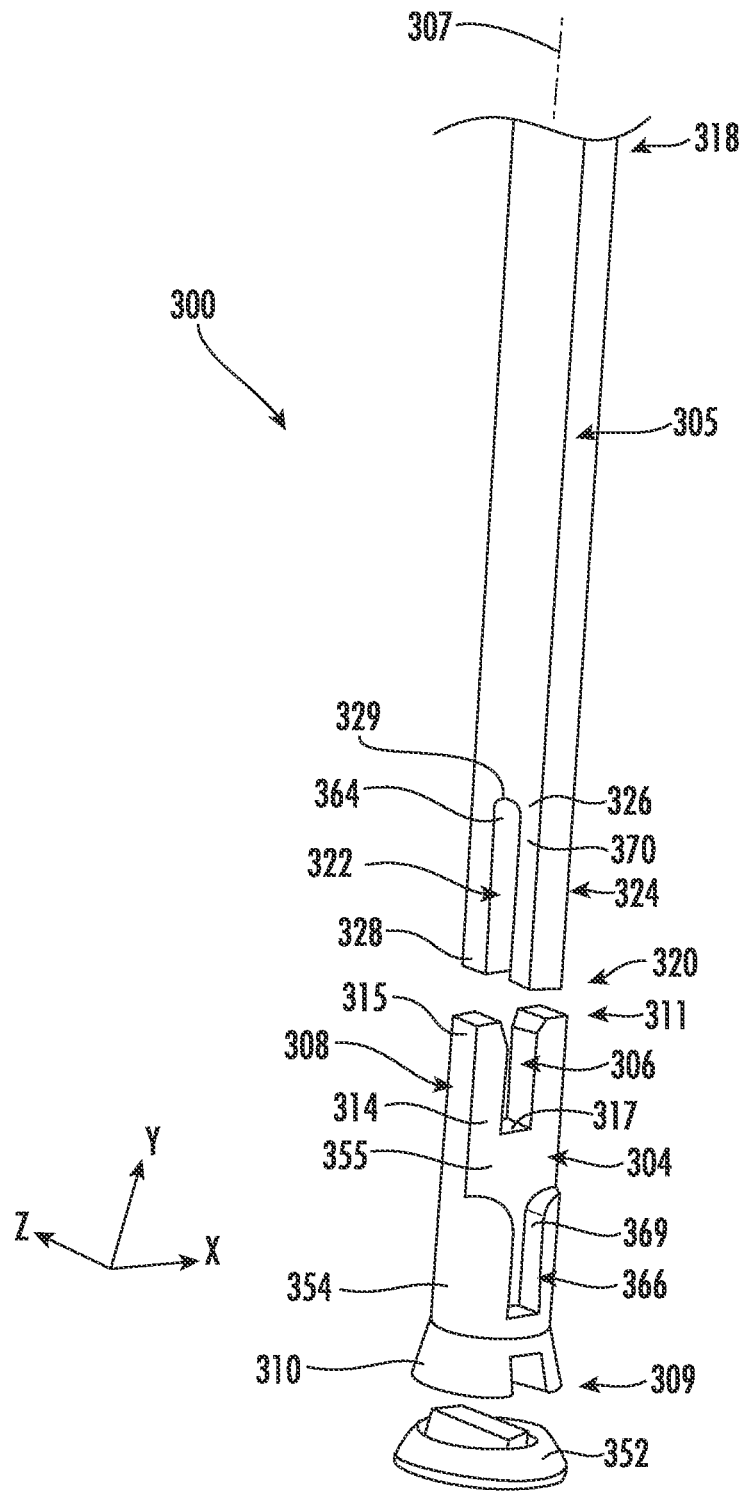
FIG. 8 is an exploded perspective view of an electrical contact according to exemplary embodiments of the present disclosure.

Turning now to FIG. 8, an electrical contact 300 according to embodiments of the present disclosure will be described. As shown, the electrical contact 300, sometimes referred to as a pin, may include a first component 304 and a second component 305 generally aligned end-to-end along a lengthwise axis 307. The electrical contact 300 is shown in a separated or disconnected configuration, wherein the first and second components 304, 305 may be coupled together after the first component 304 has been secured to a substrate (not shown).

The first component 304 may include a first end 309 opposite a second end 311. The first end 309 may include a flared base 310 to provide support to the first component 304, and to increase adhesion of the electrical contact 300 to a substrate, e.g., using a solder 352. The second end 311 may include a base slot 306 formed therein, wherein the base slot 306 is defined in part by a first set of members or prongs 308. In some embodiments, the first prongs 308 may include a base 314 and a free end 315. The free end 315 of the first prongs 308 may be configured to flex, e.g., radially away and/or towards the lengthwise axis 307 to change the width of the base slot 306. Each of the prongs 308 may be connected by a first base wall 317, which defines a closed end of the base slot 306.

The second component 305 may include a first end 318 opposite a second end 320. The second end 320 may include an upper slot 322 formed therein, wherein the upper slot 322 is defined in part by a second set of members or prongs 324. In some embodiments, the second prongs 324 may include a base 326 and a free end 328. Each of the second prongs 324 may be connected by a second base wall 329, which defines a closed end of the upper slot 322.

In this embodiment, the first component 304 may include a first section 354, which may generally be circular, and one or more planar surfaces 355 extending from the first section 354. The planar surfaces 355 may abut an inner surface 364 of the second prongs 324 when the first and second components 304, 305 are brought together. Furthermore, the first section 354 may include one or more prong slots 366 operable to receive the second prongs 324 of the second component 305. Each prong slot 366 may include a radial surface 369 operable to engage or abut a side surface 370 of the second prongs 324. It will be appreciated that the planar surface(s) 355 in contact with the inner surface 364 of the second prongs 324 generally prevents or minimizes movement or pivoting of the second component 305 along the z-direction. Meanwhile, the radial surface 369 in contact with the side surface 370 of the second prongs 324 generally prevents or minimizes movement or pivoting of the second component 305 along the x-direction.

Figure 9:
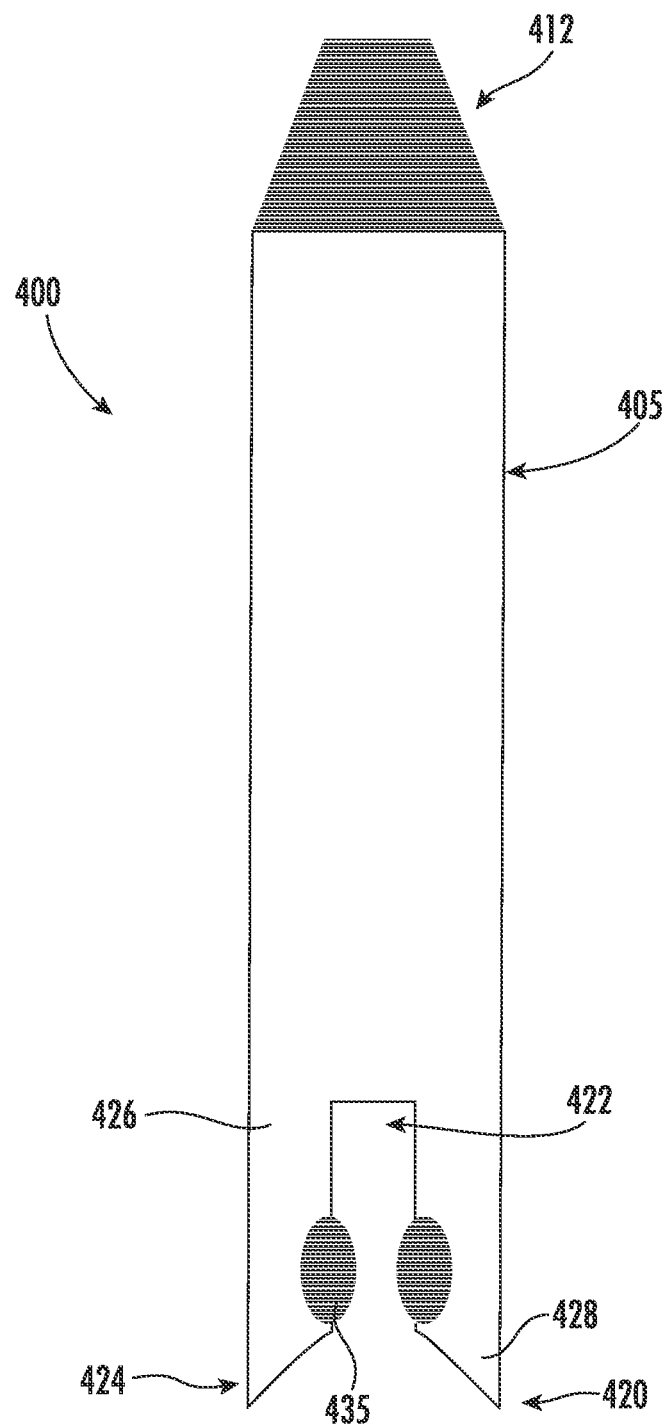
FIG. 9 is a side view of an alternative electrical contact according to exemplary embodiments of the present disclosure.

FIG. 9 is a side view of a second component 405 of an electrical contact 400 according to exemplary embodiments of the present disclosure. The electrical contact 400 may be the same or similar in many aspects to the electrical contacts 100 and 300 described above. As such, only certain aspects of the electrical contact 400 will hereinafter be discussed for the sake of brevity.

The second component 405 may include a first end 418 opposite a second end 420. The second end 420 may include an upper slot 422 formed therein, wherein the upper slot 422 is defined in part by a second set of members or prongs 424. In some embodiments, the second prongs 424 may include a base 426 and a free end 428. Between the base 426 and the free end 428 may be one or more protrusions 435 extending into the upper slot 422. The protrusions 435 may provide enhanced gripping towards the middle of the second prongs 424 to ensure surface contact between the second component 405 and the first component (not shown).

Figure 10:
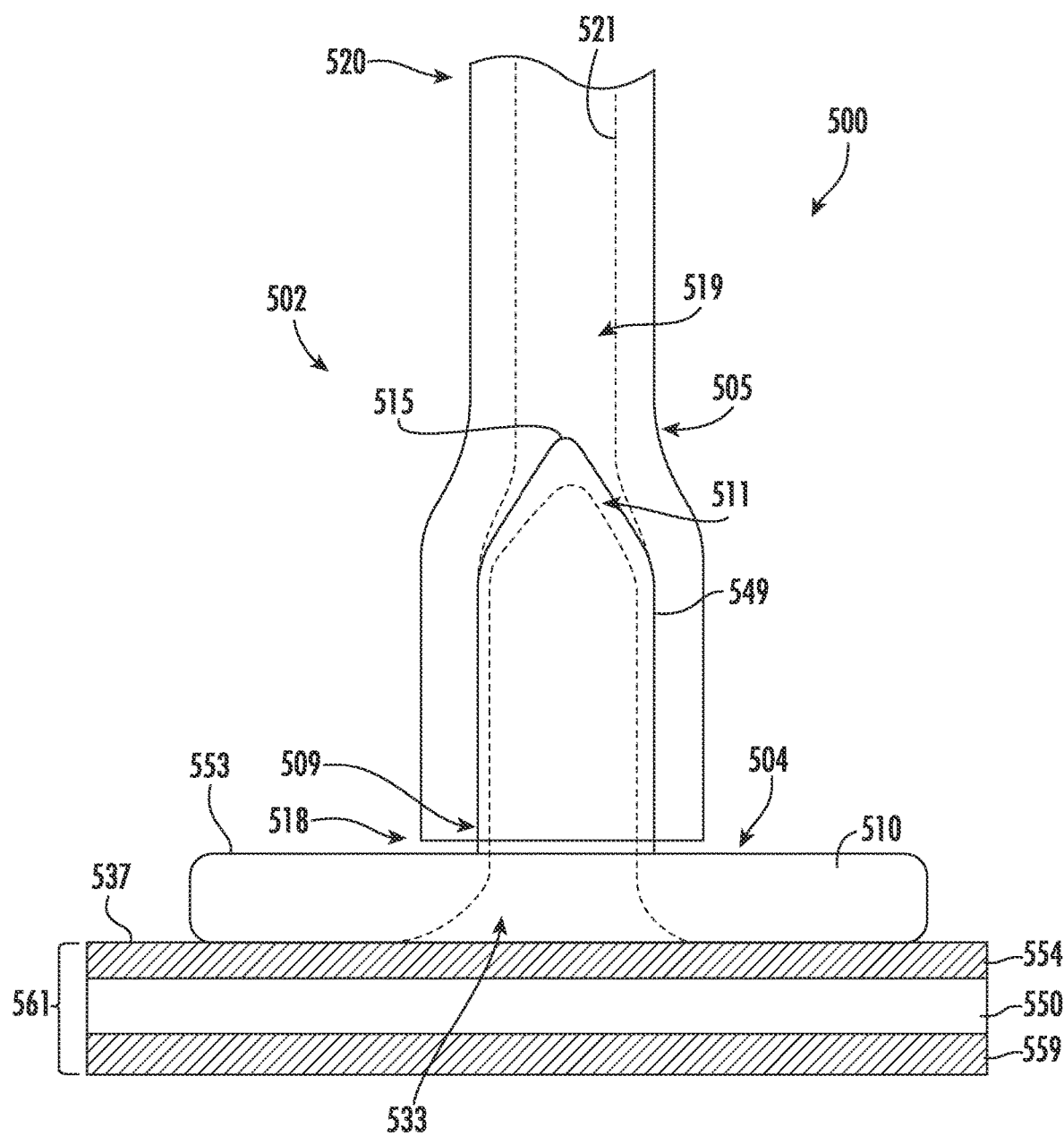
FIG. 10 is a side view of an assembly for a semiconductor package according to exemplary embodiments of the present disclosure.

FIG. 10 demonstrates another electrical contact 500 of an assembly 502 according to embodiments of the present disclosure. As shown, the electrical contact 500 may include a first component 504 and a second component 505 coupled together. In some embodiments, the first and second components 504, 505 may be coupled together after the first component 504 has been secured to a substrate 561, which may include an electrically insulating material 550 sandwiched between first and second conductive layers 554, 559.

The first component 504 may include a first end 509 opposite a second end 511. The first end 509 may include a flattened base 510 to provide support to the first component 504 and the second component 505, and to increase adhesion of the first component 504 to the substrate 561. In some embodiments, the flattened base 510 may be soldered, sintered, or brazed to a top surface 537 of the first conductive layer 554. As shown, the first component 504 may include a hollowed interior 533, which extends to the top surface 537 of first conductive layer 554. In other embodiments, the first component 504 may be solid. The second end 511 may include a pointed or sloped tip 515 extending into an interior 519 of the second component 505. In various embodiments, the second end 511 may have a square, rectangular, circular, or oval cross section. The first end 509 may also, or alternatively, have a square, rectangular, circular, or oval cross section. It will be appreciated that the cross section of the first and second ends 509, 511 may be the same or different.

The second component 505, which may be a power terminal, includes a first end 518 opposite a second end 520. It will be appreciated that the second end 520 is cut-off in the figure. The interior 519, which is defined by an internal sidewall 521, may extend between the first and second ends 518, 520. The first end 518 may extend generally to a top surface 553 of the flattened base 510. As shown, the internal sidewall 521 may be in direct physical and electrical contact with an exterior surface 549 of the first component 504. In some embodiments, the first and second components 504, 505 are fitted together, which causes the first end 518 of the second component 505 to plastically deform laterally, e.g., in a direction parallel to a plane defined by the top surface 537 of the first conductive layer 554. Although non-limiting, the first and second components 504, 505 may be same material (e.g., copper) with a same hardness, thus allowing optimal cold welding and preventing CTE mismatch during extreme temperature. In other embodiments, the first and second components 504, 505 are different materials.

Figure 11:
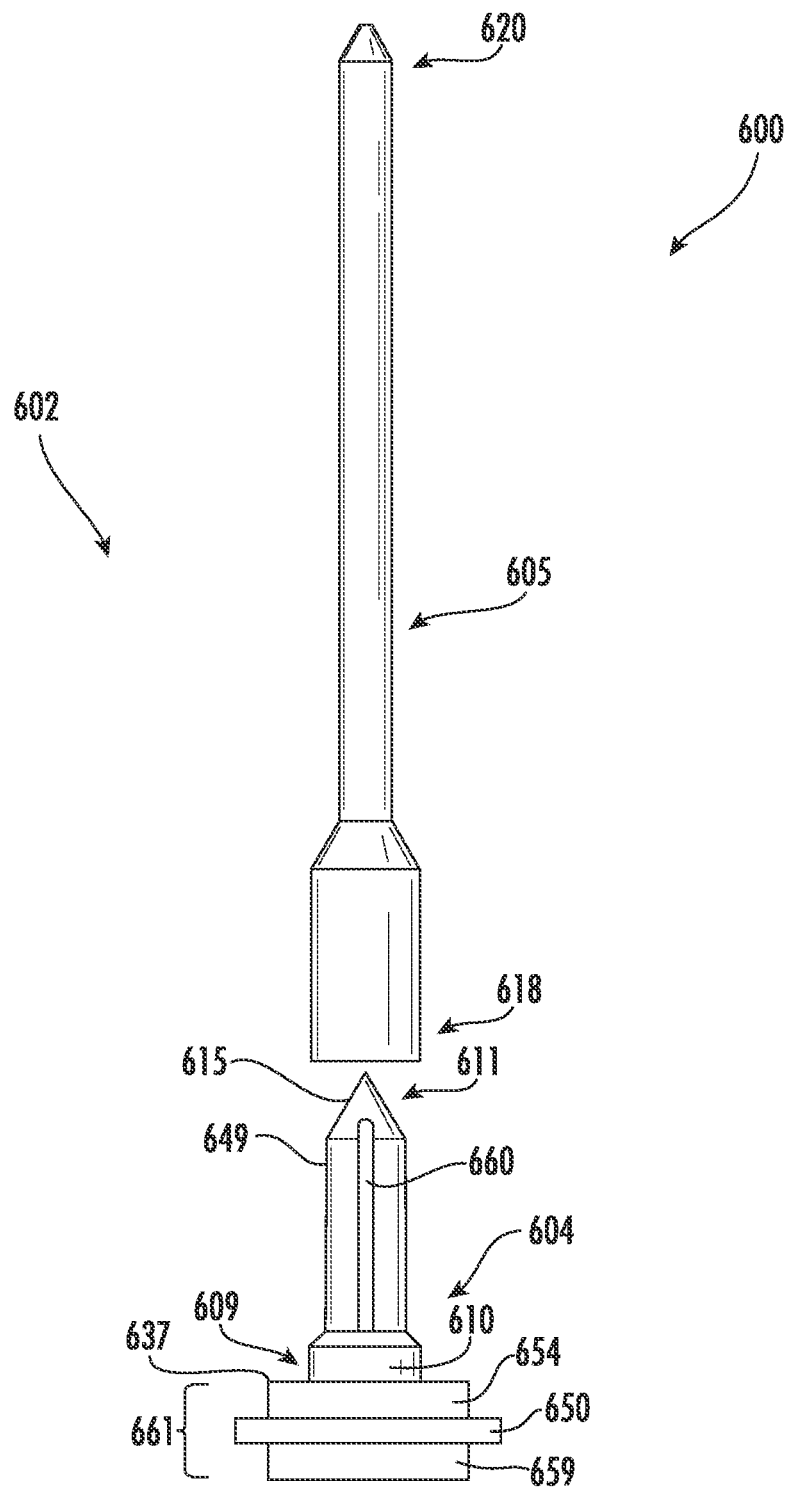
FIG. 11 is a side perspective view of an assembly for a semiconductor package according to exemplary embodiments of the present disclosure.

FIG. 11 demonstrates a partially exploded view of an electrical contact 600 of an assembly 602 according to embodiments of the present disclosure. As shown, the electrical contact 600 may include a first component 604 and a second component 605 coupled together. In some embodiments, the first and second components 604, 605 may be coupled together after the first component 604 has been secured to a substrate 661, which may include an electrically insulating material 650 sandwiched between first and second conductive layers 654, 659.

The first component 604 may include a first end 609 opposite a second end 611. The first end 609 may include a base 610 to provide support to the first component 604 and the second component 605, and to increase adhesion of the first component 604 to the substrate 661. In some embodiments, the base 610 may be soldered, sintered, or brazed to a top surface 637 of the first conductive layer 654. As shown, the first component 604 may include an exterior channel 660, which extends between the base 610 and the second end 611. In some embodiments, the exterior channel 660 functions as a stress relief feature for the assembly 602. As further shown, the second end 611 may include a pointed or sloped tip 615 extending into an interior (not shown) of the second component 605. In various embodiments, the second end 611 may have a square, rectangular, circular, or oval cross section. The first end 609 may also, or alternatively, have a square, rectangular, circular, or oval cross section. It will be appreciated that the cross section of the first and second ends 609, 611 may be the same or different.

The second component 605, which may be a power terminal, includes a first end 618 opposite a second end 620. Once coupled together, an internal sidewall of the second component 605 may be in direct physical and electrical contact with an exterior surface 649 of the first component 604. In some embodiments, the first and second components 604, 605 are fitted together, which causes the first end 618 of the second component 605 to plastically deform laterally, e.g., in a direction parallel to a plane defined by the top surface 637 of the first conductive layer 654. Although non-limiting, the first and second components 604, 605 may be same material (e.g., copper) with a same hardness, thus allowing optimal cold welding and preventing CTE mismatch during extreme temperature. In other embodiments, the first and second components 604, 605 are different materials.

Turning now to FIG. 12, a method 700 according to embodiments of the present disclosure will be described in greater detail. At block 701, the method 700 may include coupling a first component of an electrical contact to a supporting structure, the first component including a pin defined by a sloped tip. At block 702, the method 700 may further include coupling a second component to the first component, wherein the second component includes a hollow cylinder or a hollow cube.

Although the illustrative methods 200 and 700 are described above as a series of acts or events, the present disclosure is not limited by the illustrated ordering of such acts or events unless specifically stated. For example, some acts may occur in different orders and/or concurrently with other acts or events apart from those illustrated and/or described herein, in accordance with the disclosure. In addition, not all illustrated acts or events may be necessary to implement a methodology in accordance with the present disclosure. Furthermore, the methods 200 and 700 may be implemented in association with the formation and/or processing of structures illustrated and described herein as well as in association with other structures not illustrated.

As used herein, an element or step recited in the singular and proceeded with the word "a" or "an" is understood as not excluding plural elements or steps, unless such exclusion is explicitly recited. Furthermore, references to "one embodiment" of the present disclosure are not intended to be interpreted as excluding the existence of additional embodiments also incorporating the recited features.

The use of "including," "comprising," or "having" and variations thereof herein is meant to encompass the items listed thereafter and equivalents thereof as well as additional items. Accordingly, the terms "including," "comprising," or "having" and variations thereof are open-ended expressions and can be used interchangeably herein.

The phrases "at least one", "one or more", and "and/or", as used herein, are open-ended expressions and are both conjunctive and disjunctive in operation. For example, expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

All directional references (e.g., proximal, distal, upper, lower, upward, downward, left, right, lateral, longitudinal, front, back, top, bottom, above, below, vertical, horizontal, radial, axial, clockwise, and counterclockwise) are just used for identification purposes to aid the reader's understanding of the present disclosure. The directional references do not create limitations, particularly as to the position, orientation, or use of the disclosure. Connection references (e.g., attached, coupled, connected, and joined) are to be construed broadly and may include intermediate members between a collection of elements and relative movement between elements unless otherwise indicated. As such, connection references do not necessarily infer two elements are directly connected and in fixed relation to each other.

Furthermore, identification references (e.g., primary, secondary, first, second, third, fourth, etc.) are not intended to connote importance or priority, and are used to distinguish one feature from another. The drawings are for purposes of illustration, and the dimensions, positions, order and relative sizes reflected in the drawings attached hereto may vary.

Furthermore, the terms "substantial" or "approximately," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An assembly, comprising:
   a substrate; and
   an electrical contact coupled to the substrate, the electrical contact comprising:
   a first component including a base slot defined by a first set of prongs; and
   a second component including an upper slot defined by a second set of prongs, wherein the first set of prongs engage the second set of prongs when the first component and the second component are coupled together, wherein the first set of prongs and the second set of prongs are oriented parallel to a lengthwise axis extending through the first component and the second component, and wherein the lengthwise axis is perpendicular to a plane defined by an upper surface of the substrate.

2. The assembly of claim 1, further comprising at least one conductive layer formed along the substrate, wherein the first component is coupled to the conductive layer.

3. The assembly of claim 1, wherein the base slot is further defined by a first base wall, wherein the upper slot is further defined by a second base wall, and wherein the first base wall and the second base wall engage one another when the first component and the second component are coupled together.

4. The assembly of claim 1, the first component further comprising a stress relief trench.

5. The assembly of claim 4, the first component including a first end opposite a second end, wherein the first end is coupled to the substrate.

6. The assembly of claim 5, wherein the stress relief trench is formed in the first end.

7. The assembly of claim 1, wherein the first set of prongs and the second set of prongs are positioned adjacent one another when the first component and the second component are coupled together.

8. The assembly of claim 1, the first component comprising an angled tip.

9. The assembly of claim 8, the angled tip including a contact.

10. An electrical contact, comprising:
    a first component including a base slot defined by a first set of prongs, the first component coupleable with a substrate; and
    a second component including an upper slot defined by a second set of prongs, wherein the first set of prongs engage the second set of prongs when the first component and the second component are coupled together, wherein the base slot is further defined by a first base wall, wherein the upper slot is further defined by a second base wall, wherein the first base wall and the second base wall engage one another when the first component and the second component are coupled together, wherein the first set of prongs and the second set of prongs are oriented parallel to a lengthwise axis extending through the first component and the second component, and wherein the lengthwise axis is perpendicular to a plane defined by an upper surface of the substrate.

11. The electrical contact of claim 10, the first component further comprising a stress relief trench.

12. The electrical contact of claim 11, the first component including a first end opposite a second end, wherein the first end is coupled to the substrate.

13. The electrical contact of claim 12, wherein the stress relief trench is formed in the first end.

14. The electrical contact of claim 10, the first component comprising an angled tip.

15. An assembly, comprising:
    a substrate; and
    an electrical contact coupled to the substrate, the electrical contact comprising:
    a first component extending perpendicular from the substrate; and
    a second component surrounding the first component, wherein the first component extends within a hollowed interior of the second component, wherein a first set of prongs of the first component and a second set of prongs of the second component are oriented parallel to a lengthwise axis extending through the first component and the second component, and wherein the lengthwise axis is perpendicular to a plane defined by an upper surface of the substrate.

16. The assembly of claim 15, the first component including a base extending along a top surface of the substrate, wherein the second component extends to the base.

17. The assembly of claim 16, wherein the first and second components are directly coupled together, and wherein an end of the second component is expanded laterally along the base.

18. The assembly of claim 15, wherein the first component includes a hollowed interior.

\* \* \* \* \*